(12) United States Patent
Kim et al.

(10) Patent No.: US 7,138,695 B2
(45) Date of Patent: Nov. 21, 2006

(54) IMAGE SENSOR MODULE AND METHOD FOR FABRICATING THE SAME

(75) Inventors: Ho Kyoum Kim, Suwon-shi (KR); Young Jun Kim, Suwon-shi (KR); In Soon Yu, Seoul (KR)

(73) Assignee: Samsung Electro-Mechanics Ltd., Suwon-Shi (KR)

( * ) Notice: Subject to any disclaimer, the term of this patent is extended or adjusted under 35 U.S.C. 154(b) by 173 days.

(21) Appl. No.: 09/901,487

(22) Filed: Jul. 9, 2001

(65) Prior Publication Data

US 2002/0171031 A1 Nov. 21, 2002

(30) Foreign Application Priority Data

May 16, 2001 (KR) ................. 2001-26774

(51) Int. Cl.
*H05K 7/02* (2006.01)
*H01L 31/0203* (2006.01)

(52) U.S. Cl. ................... 257/433; 361/728
(58) Field of Classification Search ............ 250/208.1; 257/E23.021, 737, 431, 433, 434, 678–733, 257/777, 778, 680; 438/613, 64, 106, 124–127, 438/108, 15, 26, 51, 55; 361/728
See application file for complete search history.

(56) References Cited

U.S. PATENT DOCUMENTS

| | | | | |
|---|---|---|---|---|
| 4,594,613 A | * | 6/1986 | Shinbori et al. ............. 348/340 |
| 5,442,134 A | * | 8/1995 | Miyazaki et al. .......... 174/52.4 |
| 5,731,231 A | * | 3/1998 | Miyajima ................... 438/124 |
| 5,861,654 A | * | 1/1999 | Johnson ...................... 257/433 |
| 5,998,862 A | * | 12/1999 | Yamanaka .................. 257/704 |
| 6,031,282 A | * | 2/2000 | Jones et al. ................. 257/692 |
| 6,046,070 A | * | 4/2000 | Shoji et al. ................... 438/66 |
| 6,268,231 B1 | * | 7/2001 | Wetzel ......................... 438/48 |

FOREIGN PATENT DOCUMENTS

| | | | | |
|---|---|---|---|---|
| JP | 01-095553 | * | 4/1989 | ................. 257/434 |
| JP | 01-248542 | * | 4/1989 | |
| JP | 3-11757 | * | 1/1991 | |

* cited by examiner

*Primary Examiner*—Stephen Meier
*Assistant Examiner*—Julian D. Huffman
(74) *Attorney, Agent, or Firm*—Darby & Darby

(57) ABSTRACT

Disclosed is a method for packaging a pickup device, which is used for a digital optical instrument, and particularly a method for fabricating an image sensor module connected to a flexible PCB. The method according to the invention includes the steps of forming a printed circuit of a predetermined pattern on an upper surface of a transparent medium, forming a first bump and a second bump on the upper surface of the transparent medium, first bonding the first bump with a pattern of an image chip so as to be electrically connected to each other, secondly bonding the second bump with a circuit of a flexible PCB so as to be electrically connected to each other, and molding a rear surface of the flexible PCB, on which an image chip is mounted, by means of epoxy resin. The method according to the invention provides an effect of reducing weight, thickness, length and size of the module in comparison with the module fabricated under the conventional wire bonding method.

13 Claims, 12 Drawing Sheets

IMAGE SENSOR MODULE AND METHOD FOR FABRICATING THE SAME

BACKGROUND OF THE INVENTION

1. Field of the Invention

The present invention relates to a method for packaging a pickup device, which is used for a digital optical instrument, and in particular, an image sensor module and a method for fabricating the same that can be realized by changing the conventional wire bonding method to a gold bump method to minimize the thickness of a package comprising a solid-state pickup device, which is referred to as CCD or CMOS, and by subsequently changing the fabricating process.

2. Description of the Related Art

Following the recent trend of seeking high intelligence, high integration and minimization of electronic devices, semiconductor packages are realized with high intelligence and high density. Technologies in semiconductor device packages have also sought minimization, slimming, high density and high performance.

Recently, high intelligent video cameras are under development to facilitate portability owing to small size and light weight as home appliances. Consumers' demand has also been directed to a high screen quality including faithful color reproducibility and detailed expression. To meet such demand, technical levels of manufacturing camera parts have been notably improved, especially in increasing pixel numbers of a solid-state pickup device, i.e., the CCD or the CMOS, which is often referred to as a heart of a video camera.

FIG. 1 is a cross sectional view of a solid-state pickup device according to the conventional ceramic packaging method. Referring to FIG. 1, the drawing reference numeral 1 identifies a ceramic package having a surface, in which a metalized conductor is formed, and a concave portion 3 at the center thereof. A CCD or CMOS chip 4 is die-bonded with the concave portion 3 by means of a conductive adhesive 5, etc. An electrode pad 6 of the CCD or CMOS is wire-bonded with the metalized conductor 2 by means of a metal wire 7. The drawing reference numeral 8 identifies a reed terminal deposited on a facet of the metalized conductor 2, which is exposed to a side surface of the ceramic package 1.

FIG. 2 is a cross sectional view of a solid-state pickup device according to the conventional resin packaging method. Referring to FIG. 2, a reed frame 11 comprising an internal reed 9 and an external reed 10 is die-bonded with a concave portion 13 provided at the center of a molded resin package 12 by means of a conductive paste 14. As in case of the ceramic packaging in FIG. 1, an electric pad 6 on a CCD or CMOS chip 4 is wire-bonded with the internal reed 9 by means of a metal wire 7.

The conventional image sensor chip packages as described above are fabricated by undergoing processes of sawing the wafer-state chips, die-bonding each separate chip with a surface of a PCB, wire-bonding the chips with the PCB for electric connection, and air-tightly bonding a module by means of glass.

However, the image sensor package as described above not only fails to meet the current trend of reducing weight, thickness, length and size thereof but also has a limit in reducing the size of the CMOS module. Furthermore, hollows created around an image area (i.e., an image recognizing part) poses a problem in the packaging process of precluding particles from the hollows. Moreover, the chips connected to the PCB by a wire have a deteriorated electric characteristic because of the long electric path.

In addition, soldering to connect the image sensor module to a digital signal processor board complicates a post-process. Also, the position of the image sensor module cannot be freely defined on an instrument because the image sensor module needs to be soldered on a fixed position of the DSP board.

SUMMARY OF THE INVENTION

It is, therefore, an object of the present invention to provide an image sensor module and a method for fabricating the same that can be realized by changing the conventional wire bonding method to a gold bump method to minimize the thickness of a package comprising a solid-state pickup device, which is referred to as CCD or CMOS, and by subsequently changing the fabricating process so as to reduce weight, thickness, length and size as well as to enhance air-tightness and reliability of the image sensor module.

It is another object of the present invention to provide an image sensor module and a method for fabricating the same to correspond to the type of a PCB, on which an image sensor is seated, i.e., to a flexible PCB or a hard PCB, according to the change of the conventional wire bonding method to a gold bump method.

It is still another object of the present invention to provide an image sensor module and a method for fabricating the same that can drastically reduce weight, thickness, length and size thereof by eliminating almost all of the hollows created between a chip and glass (or an IT-filter) by the conventional method, which allocates the glass on a surface right above an image area (an image recognizing part) of the image sensor as well as by realizing air-tightness of the image area.

To achieve the above objects, there is provided an image sensor module according to one aspect of the present invention, comprising: a flexible PCB for transferring and transmitting electric signals; an image chip seated in a hollow area formed on a side surface of the flexible PCB; a predetermined transparent medium having a printed circuit of a predetermined pattern on an upper surface thereof; a first bump and a second bump formed on the upper surface of the transparent medium, the first bump being electrically connected to the chip pattern of the image sensor seated on the flexible PCB by bonding, and the second bump being electrically connected to the circuit of the flexible PCB; and epoxy resin molded to a portion of a rear surface of the flexible PCB, on which an image chip is mounted.

Here, the predetermined transparent medium is either glass or an IR filter.

The image chip is seated on a hollow area formed in a predetermined portion of the flexible PCB so that the pattern of the image chip can be matched with the first bump, and that the bonded transparent medium can be disposed therebetween.

The bumps are composed of a medium having high conductivity such as gold or lead.

The bonding is performed by means of ultrasonic wave or heat.

There is also provided a method for fabricating an image sensor module according to one aspect of the present invention, the method comprising the steps of: forming a printed circuit of a predetermined pattern on an upper surface of a transparent medium; forming a first bump and a second bump on the upper surface of the transparent medium; first bonding the first bump with a pattern of an image chip so as to be electrically connected to each other; secondly bonding the second bump with the circuit of a flexible PCB so as to be electrically connected to each other; and molding a portion connected to a rear surface of the flexible PCB, on which the image chip is mounted, by means of epoxy resin.

Here, the predetermined transparent medium is either glass or an IR filter.

The first bonding step is performed by seating the image chip in the space of the flexible PCB cut at a size equivalent thereto so that a pattern of the image chip can be matchably bonded with the first bump, and that the transparent medium can be disposed therebetween.

The bumps are composed of a medium of high conductivity such as gold or lead.

The bonding is performed by means of ultrasonic wave or heat.

According to another aspect of the present invention, there is provided an image sensor module comprising: a PCB for transferring and transmitting electric signals; an image chip seated in a hollow area formed on a side surface of the PCB; a predetermined transparent medium having a printed circuit of a predetermined pattern on an upper surface thereof a first bump and a second bump formed on the upper surface of the transparent medium, the first bump being electrically connected to a pattern of an image chip sensor seated on the flexible PCB by bonding, and the second bump being electrically connected to the circuit of the flexible PCB; epoxy resin molded to a portion of a rear surface of the flexible PCB, on which an image chip is mounted; and a molded material filled up with the epoxy resin to a glass surface between the first bump and the second bump for maintaining air-tightness.

Here, the predetermined transparent medium is either glass or an IR filter.

The image chip is seated on a hollow area formed in a predetermined portion of the flexible PCB so that a pattern of an image chip can be matchably bonded with the first bump, and that the transparent medium can be disposed therebetween.

The bumps are composed of a medium having high conductivity such as gold or lead.

The bonding is performed by means of ultrasonic wave or heat.

According to another aspect of the present invention, there is also provided a method for fabricating an image sensor module, comprising the steps of: forming a printed circuit of a predetermined pattern on an upper surface of a transparent medium; forming a first bump and a second bump on the upper surface of the transparent medium; first bonding the first bump with a pattern of an image chip so as to be electrically connected to each other; secondly bonding the second bump with a circuit of a hard PCB so as to be electrically connected to each other; and molding a rear surface of the hard PCB, on which an image chip is mounted, by means of epoxy resin.

Here, the predetermined transparent medium is either glass or an IR filter.

The first bonding step is performed by seating the image chip in the space of the flexible PCB cut at a size equivalent thereto so that a pattern of the image chip can be matchably bonded with the first bump, and that the transparent medium can be disposed therebetween.

The bumps are composed of a medium of high conductivity such as gold or lead.

The bonding is performed by means of ultrasonic wave or heat.

BRIEF DESCRIPTION OF THE DRAWINGS

The above and other objects, features and advantages of the present invention will become more apparent from the following detailed description when taken in conjunction with the accompanying drawings, in which.

DETAILED DESCRIPTION OF THE PREFERRED EMBODIMENTS

Figure 1:
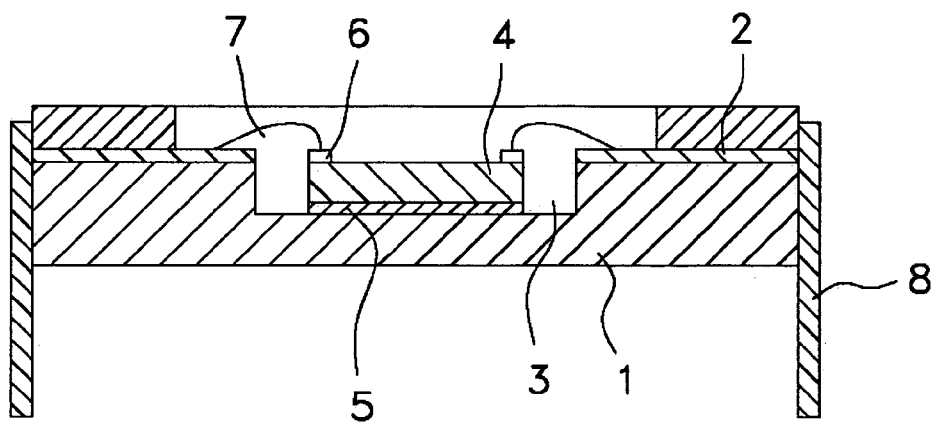
FIG. 1 is a cross-sectional view of a solid-state pickup device according to a conventional technology.
Figure 2:
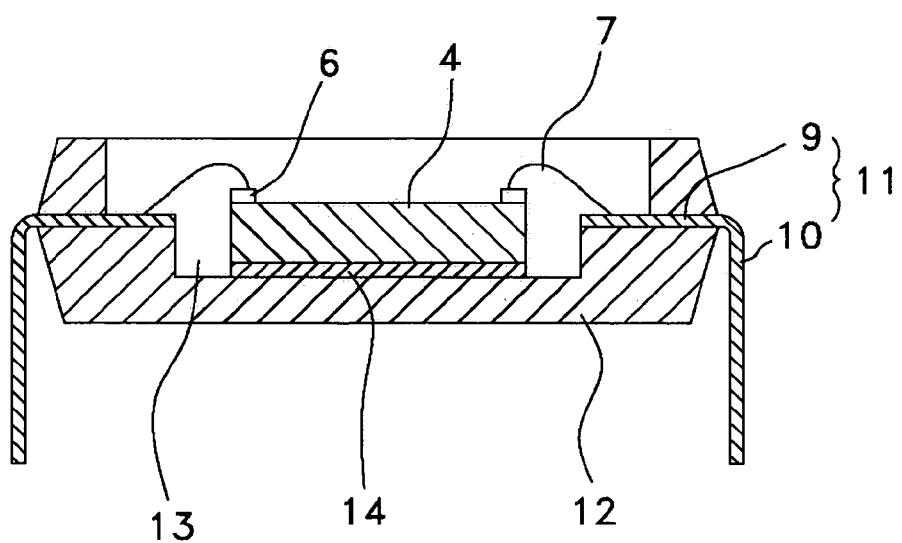
FIG. 2 is a cross-sectional view of a solid-state pickup device according to another conventional technology.

Preferred embodiments of the present invention will now be described with reference to the accompanying drawings. In the following description, same drawing reference numerals are used for the same elements even in different drawings. The matters defined in the description such as a detailed construction and elements of a circuit are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

The preferred embodiments of the present invention should be classified into two types in terms of changing the conventional wire bonding method to the gold bump method. In other words, the classification is based on types of the PCB, on which the image sensor is seated. The first type is a flexible PCB, and the other type is a hard PCB.

An embodiment applicable to the flexible PCB will be described first.

Figure 3:
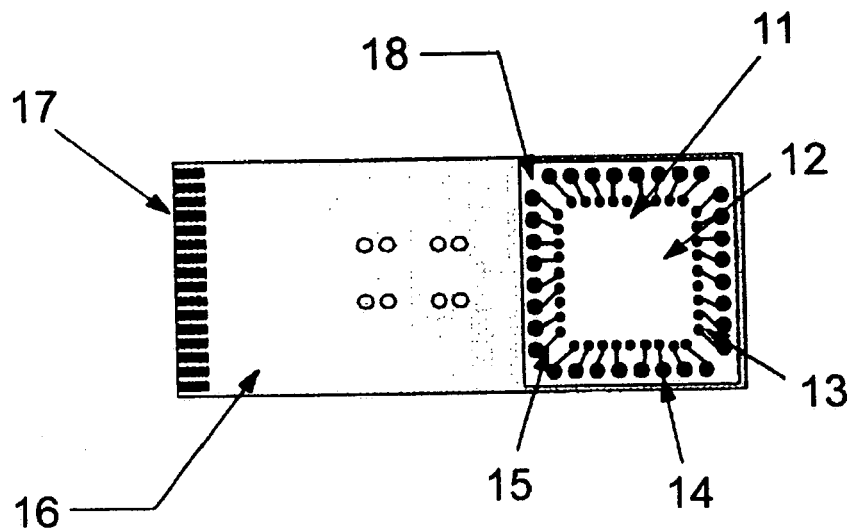
FIG. 3 is a top plan view of an image sensor module applied to a flexible PCB according to the present invention.
Figure 4:
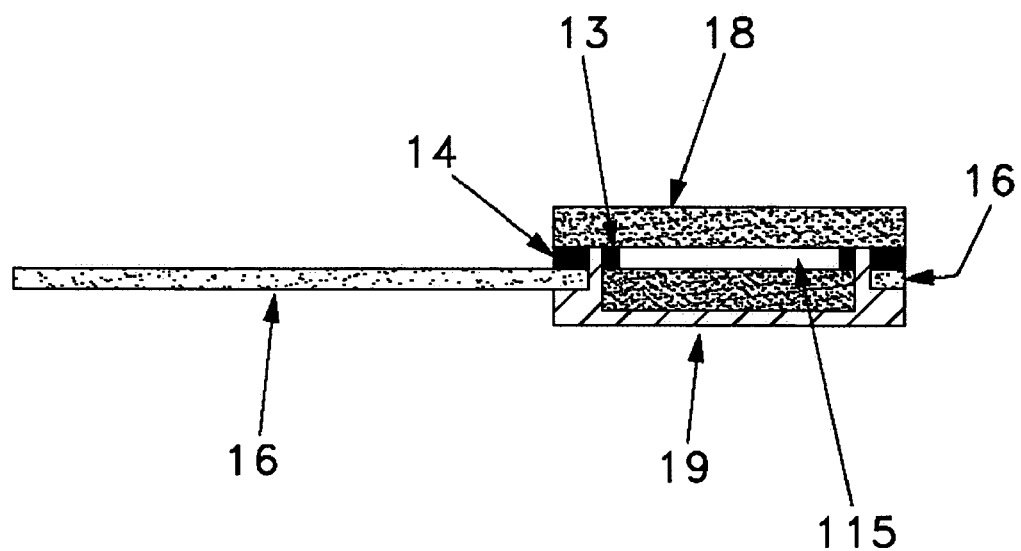
FIG. 4 is a side sectional view of an image sensor module applied to a flexible PCB according to the present invention.
Figure 5:
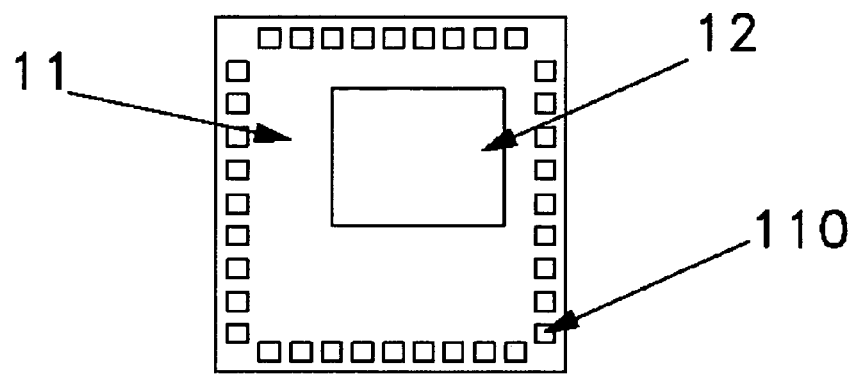
FIG. 5 is a top plan view of a CMOS image sensor chip.

FIGS. 3 and 4 are a top plan view and a cross-sectional view of an F-COG (flexible PCB chip on glass) CMOS image sensor module illustrating a construction thereof according to the present invention. As shown in FIGS. 3 and 4, the F-COG CMOS image sensor module comprises a flexible PCB 16 for transferring and transmitting electric signals, an image chip 11 seated in a hollow area formed on a side surface of the flexible PCB 16, a predetermined transparent medium 18 having a printed circuit of a predetermined pattern on an upper surface thereof, a first bump 13 and a second bump 14 formed on the upper surface of the transparent medium 18, the first bump 13 being electrically connected to a pattern of the image chip of an image sensor seated on the flexible PCB 16 by bonding, and the second bump 14 being electrically connected to the circuit of the flexible PCB 16; and epoxy resin 19 epoxy resin molded to a portion of a rear surface of the flexible PCB 16, on which an image chip is mounted.

Here, the drawing reference numeral 17 identifies a connector terminal, while the drawing reference numeral 12 identifies an image recognizing part of the image chip 11. The drawing reference numeral 110 identifies a pattern of the chip to be electrically connected to the first gold bump on glass.

The drawing reference numeral 115 identifies an air-tight space between the chip and the glass, while the drawing reference numeral 114 identifies a printed circuit on the flexible PCB. The drawing reference numeral 113 identifies a space, in which the chip is inserted, while the drawing reference numeral identifies a hollow area, in which the chip is supposed to be inserted.

Figure 6:
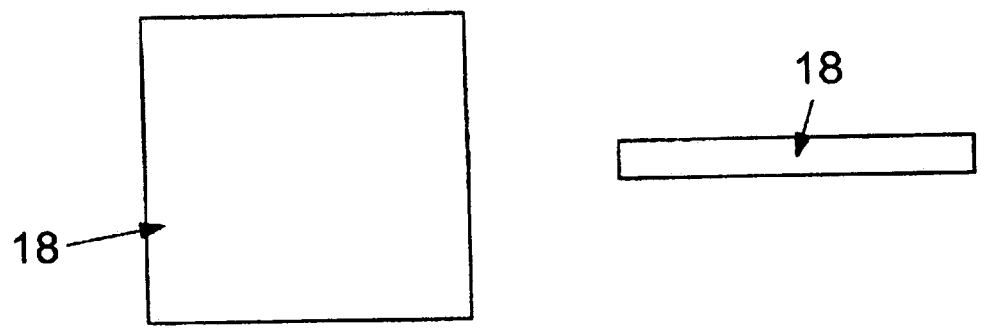
FIGS. 6 to 9 are diagrams exemplifying the steps of forming gold bumps.
Figure 7:
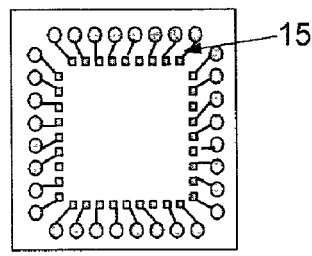
Figure 8:
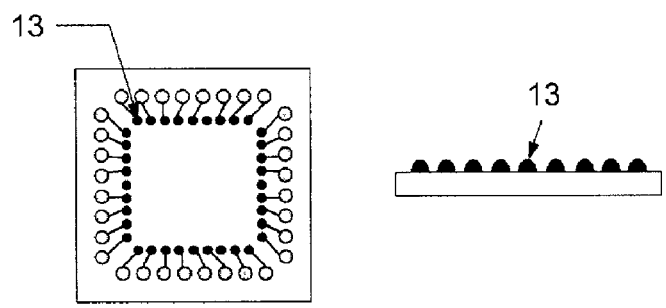
Figure 9:
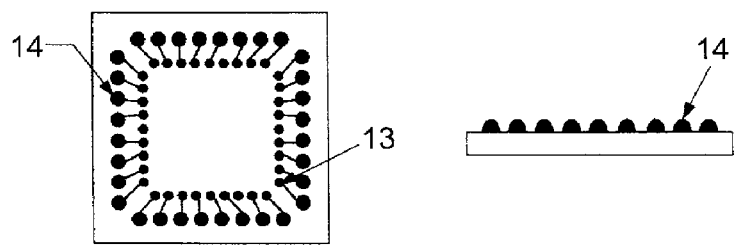
Figure 10:
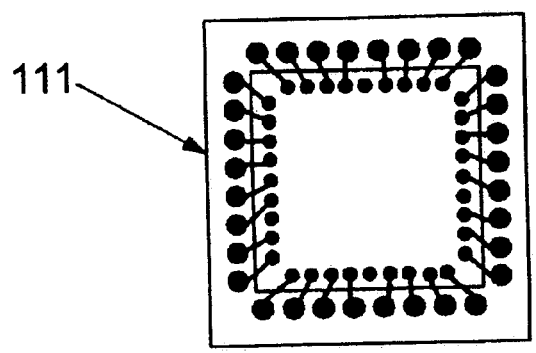
FIG. 10 is a top plan view of the chip bonded with glass after forming the gold bumps.
Figure 11:
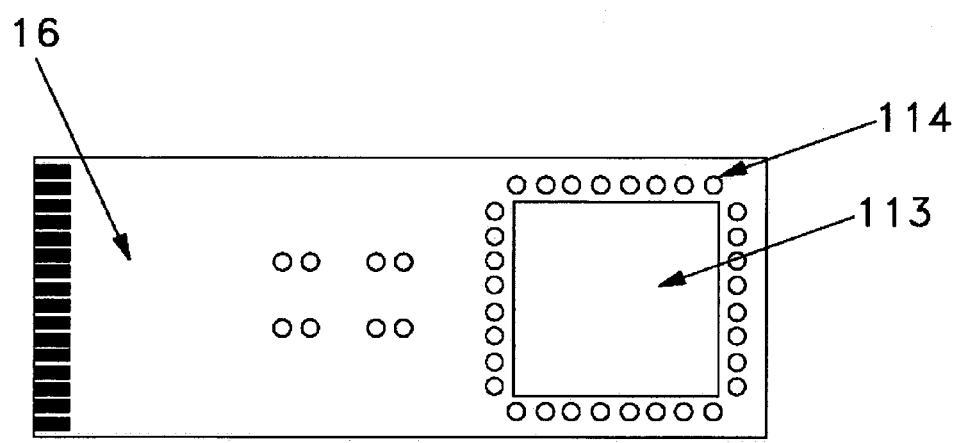
FIG. 11 is a top plan view of a flexible PCB having a space cut at a size equivalent to the glass, which has been formed by thermally bonding the CMOS image sensor chip with the first gold bump on the glass.
Figure 12:
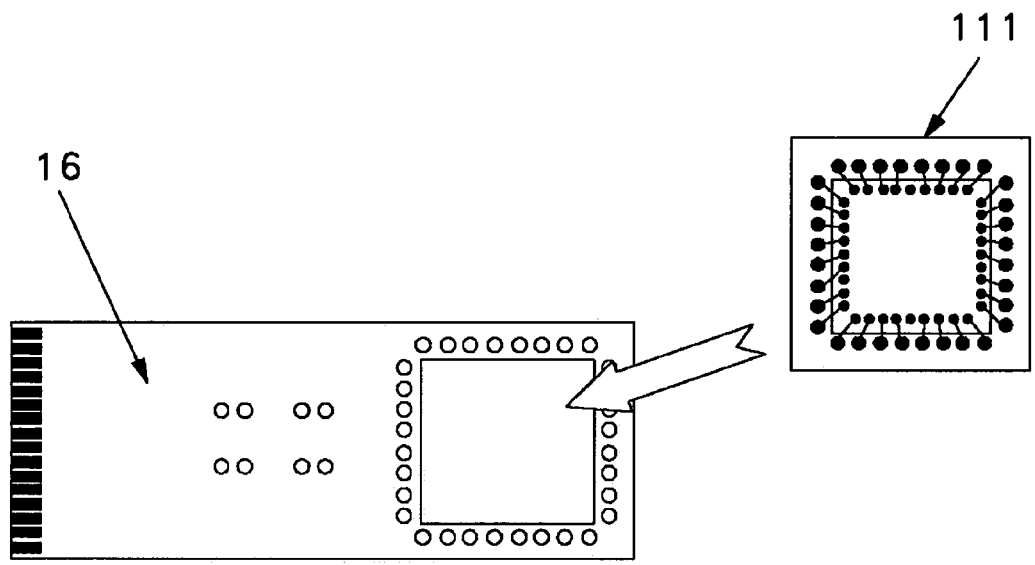
FIG. 12 is a diagram exemplifying a step of inserting the glass thermally bonded with the CMOS image sensor chip to the flexible PCB.

The following is a description of a process of fabricating an image sensor module according to the present invention. FIG. 6 shows a top plan view and a cross sectional view of glass or an IR-filter (hereinafter, referred to as "glass") before a printed circuit is formed. FIG. 7 is a top plan view of the glass, on which the printed circuit has been formed. FIG. 8 shows a top plan view and a cross sectional view of the glass after forming the first gold bump to be electrically connected to the image sensor chip. FIG. 9 shows a top plan view and a cross sectional view of the glass after forming the second gold bump to be electrically connected to the flexible PCB. FIG. 10 is a top plan view of the chip bonded with glass by means of ultrasonic wave and heat after forming the first and the second bumps;

FIG. 11 is a top plan view of a flexible PCB having a space cut at a size equivalent to the glass, which has been formed by thermally bonding the CMOS image sensor chip with the first gold bump on the glass. FIG. 12 is a diagram exemplifying a step of inserting the glass thermally bonded with the CMOS image sensor chip to the flexible PCB.

Figure 13:
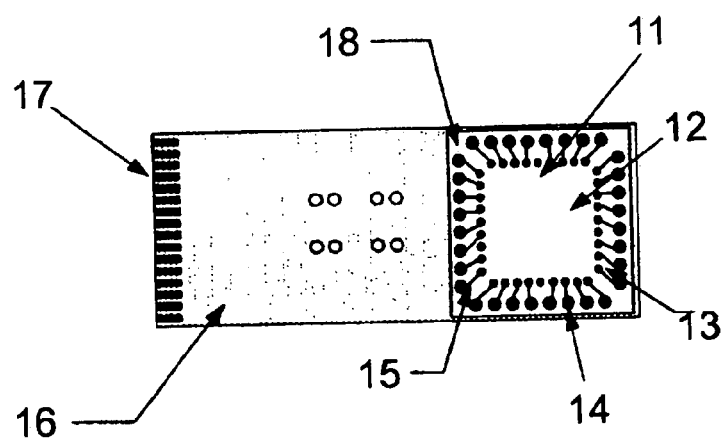
FIG. 13 is a top plan view of a flexible PCB illustrating a state that the glass thermally bonded with the CMOS image sensor chip has been inserted to the PCB, and that a second gold bump of the glass has been bonded with the PCB by means of ultrasonic wave and heat.
Figure 14:
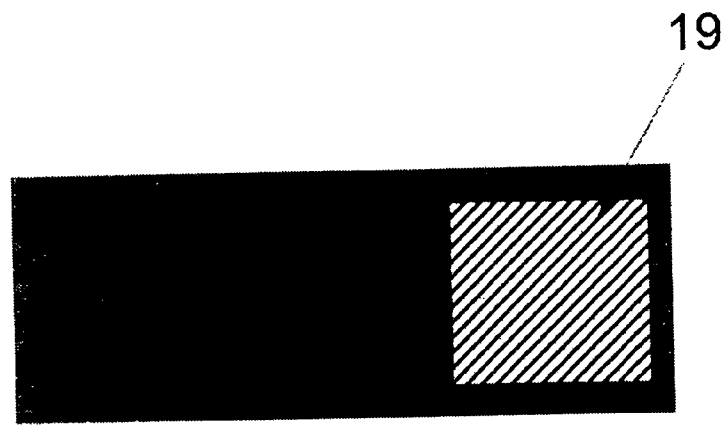
FIG. 14 is a top plan view of the flexible PCB illustrating a state that epoxy resin has been molded after undergoing the processes from FIGS. 3 to 13.
Figure 15:
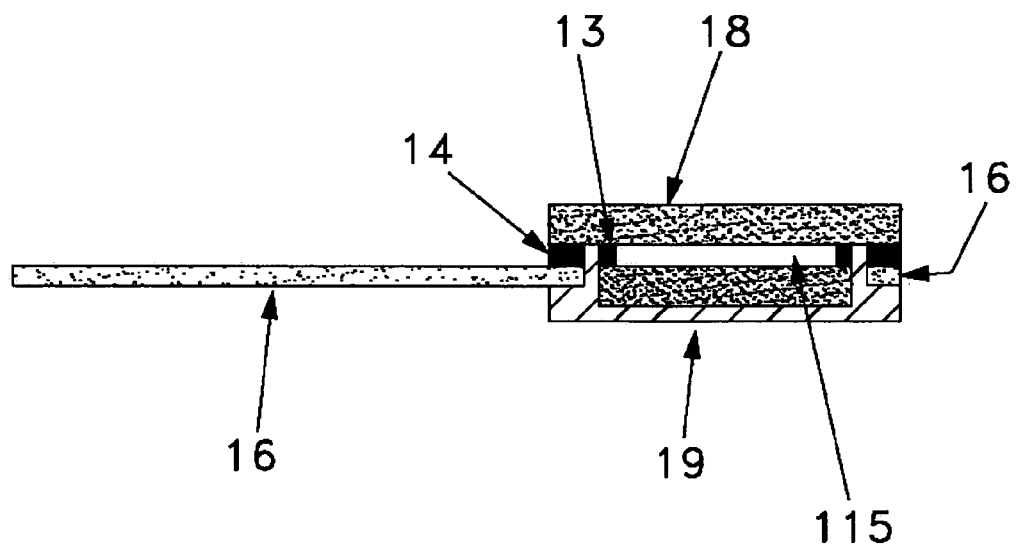
FIG. 15 is a cross sectional view of the flexible PCB illustrating a state that epoxy resin has been molded after taking the steps up to FIG. 13.

FIG. 13 is a top plan view of a flexible PCB illustrating a state that the glass thermally bonded with the CMOS image sensor chip has been inserted to the PCB, and that a second gold bump of the glass has been bonded with the PCB by means of ultrasonic wave and heat. FIGS. 14 and 15 are a top plan view and a cross sectional view of the flexible PCB illustrating a state that epoxy resin has been molded after undergoing the processes from FIGS. 3 to 13.

Accordingly, a printed circuit 15 is formed on the glass 18. A pattern of the circuit includes the first gold bump 13 and the second gold bump 14.

As shown in FIG. 8, the first gold bump 13 is formed on the glass 18 so as to be electrically connected to the pattern 110 of the CMOS image sensor chip.

Thereafter, the second gold bump 14 is formed on the glass so as to be electrically connected to the flexible PCB 16 as shown in FIG. 9.

Then, as shown in FIG. 4, the glass (refer to FIG. 9) is bonded with the CMOS image sensor chip 11 by means of ultrasonic wave and heat so that the pattern 110 of the chip 11 can be electrically connected to the first gold bump 13.

As shown in FIG. 11, the glass 111, which has been bonded with the CMOS image sensor chip 11 by means of ultrasonic wave and heat so that the pattern 110 of the chip 11 can be electrically connected to the first gold bump 13, is inserted to the space 113 cut at a size equivalent to the chip 11 of the flexible PCB 112 as shown in FIG. 12.

As shown in FIG 13, the circuit 114 is bonded with the second gold bump 4 by means of ultrasonic wave and heat so as to be electrically connected to each other.

After taking the steps up to FIG. 13, a rear surface of the flexible PCB 16 is molded by means of epoxy resin, as shown in FIGS. 14 and 15, so as to air-tighten an image area 12 of the chip 11 and the chip 11. Here, the molded portion 19 serves to maintain air-tightness among the chip 11, the glass 111 and the flexible PCB 16.

The method applicable to the flexible PCB described above is also applicable to the hard PCB. The following is a description of that embodiment made with reference to FIGS. 16 to 28.

Figure 16:
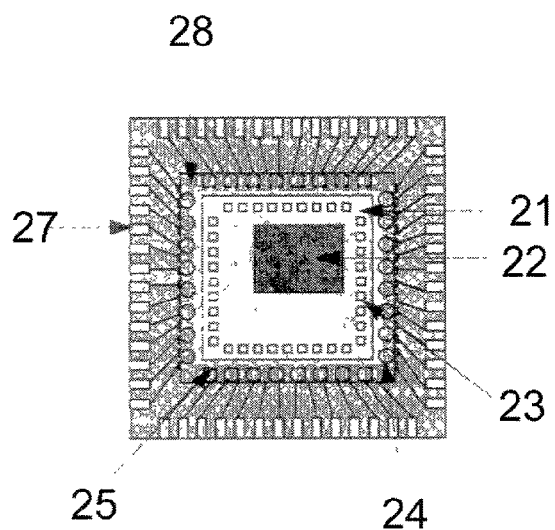
FIG. 16 is a top plan view of a COG (chip on glass) CMOS image sensor module illustrating a construction thereof according to the present invention.
Figure 17:
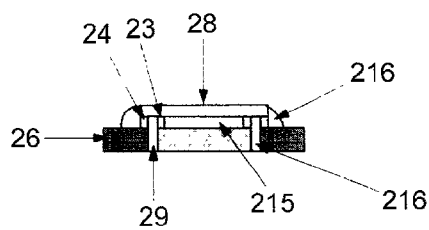
FIG. 17 is a cross sectional view of a COG CMOS image sensor module illustrating a construction thereof according to the present invention.

FIGS. 16 and 17 are a top plan view and a cross sectional view of a COG CMOS image sensor module illustrating a construction thereof according to the present invention. The COG CMOS image sensor module comprises a PCB 26 for transferring and transmitting electric signals, an image chip 21 seated in a hollow area formed on a side surface of the PCB 26, a predetermined transparent medium 28 having a printed circuit 25 of a predetermined pattern on an upper surface thereof, a first bump 23 and a second bump 24 on an upper surface of the transparent medium 28, the first bump 23 being bonded with a pattern of the chip of an image sensor seated on the PCB 26 so as to be electrically connected, and the second bump 24 being bonded with the circuit of the PCB 26 as to be electrically connected, and epoxy resin 29 molded to a portion of a rear surface of the PCB 26, on which the image chip is mounted.

The drawing reference numerals representing the constitutional elements of the present invention but are not shown in the drawings are as follows: 22 for an image recognizing part of the chip; 27 for an array of cable pins of the PCB; 210 for a pattern to be electrically connected to the first gold bump on the glass; 211 for the glass, in which the first and the second gold bump have been completely formed; 212 for the PCB having a space cut at a size equivalent to the chip; 213 for the space, in which the chip is to be inserted; 214 for a printed circuit on the PCB; 215 for the space air-tightened between the chip and the glass; 216 for the molded portion filled up with molding resin to the glass surface between the first gold bump and the second gold bump to maintain air-tightness.

The following is a description of a process of fabricating an image sensor module according to the present invention made with reference to the accompanying drawings.

Figure 18:
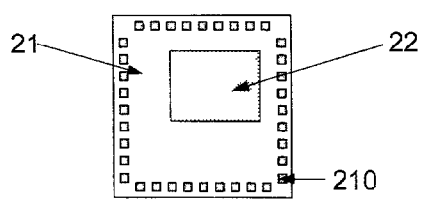
FIG. 18 is a top plan view of the CMOS image sensor chip.
Figure 19:
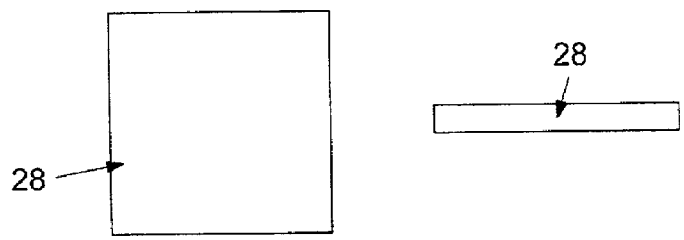
FIGS. 19 to 22 are diagrams exemplifying the steps of forming the gold bump.
Figure 20:
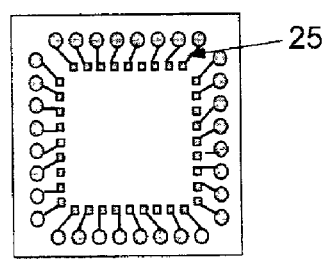
Figure 21:
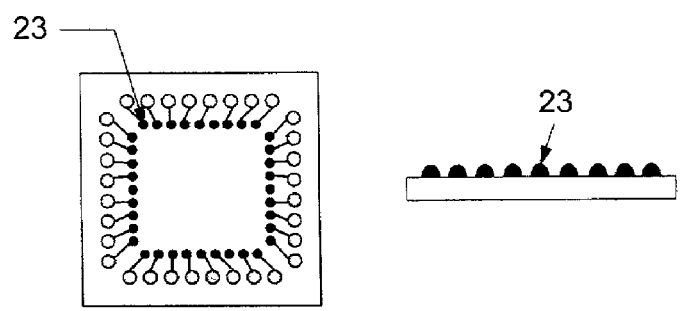
Figure 22:
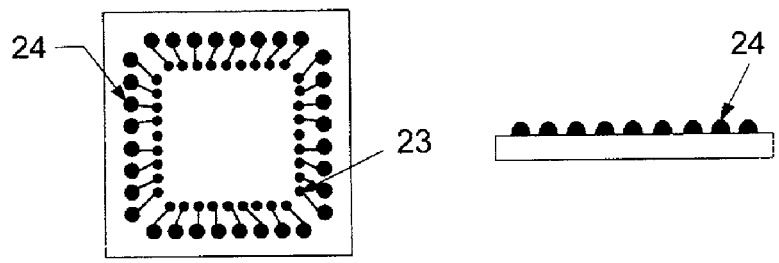

FIG. 18 is a top plan view of the CMOS image sensor chip. FIG. 19 shows a top plan view and a cross sectional view of the glass before the printed circuit is formed. FIG. 20 is a top plan view of the glass, on which the printed circuit has been formed. FIG. 21 shows a top plan view and a cross sectional view of the glass after the first gold bump has been formed so as to be electrically connected to the image sensor chip. FIG. 22 shows a top plan view and a cross sectional view of the glass after the first and the second gold bumps have been formed so as to be electrically connected to the flexible PCB.

Figure 23:
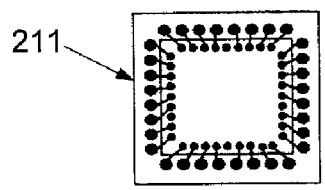
FIG. 23 is a top plan view of the CMOS image sensor chip, with which the glass has been bonded by means of ultrasonic wave and heat.
Figure 24:
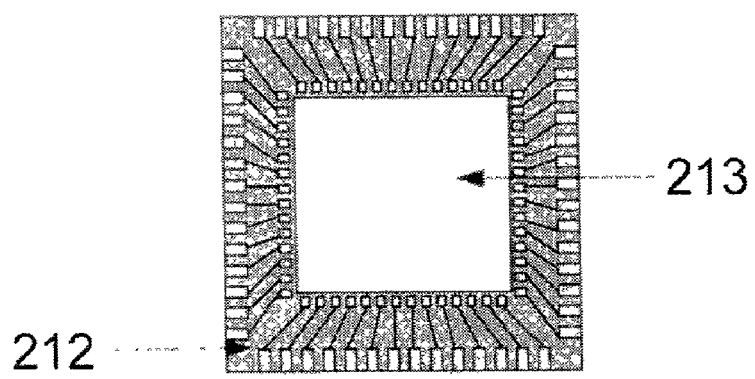
FIG. 24 is a top plan view of the PCB having a space cut at a size equivalent to the space matchable with the glass including the CMOS image sensor chip thermally bonded with the first gold bump in FIG. 23.
Figure 25:
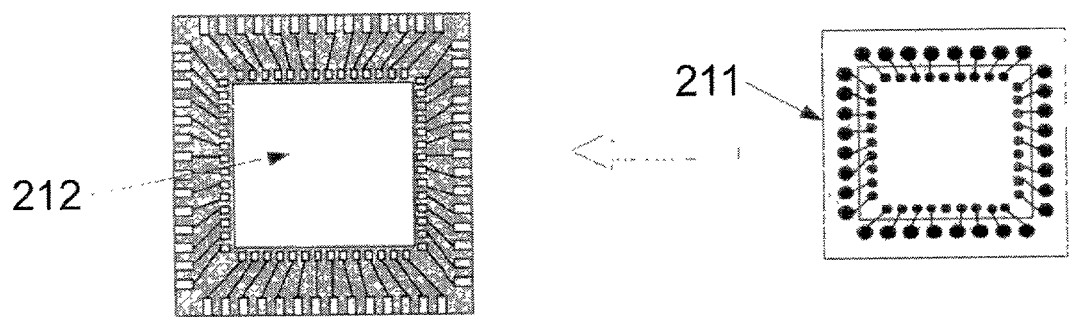
FIG. 25 is a view of the PCB illustrating a step of inserting the glass including the CMOS image sensor chip bonded by means of ultrasonic wave and heat thereto.

FIG. 23 is a top plan view of the CMOS image sensor chip, with which the glass has been bonded by means of ultrasonic wave and heat. FIG. 24 is a top plan view of the PCB having a space cut at a size equivalent to the space matchable with the glass including the CMOS image sensor chip thermally bonded with the first gold bump in FIG. 23. FIG. 25 is a view of the PCB illustrating a step of inserting the glass including the CMOS image sensor chip bonded by means of ultrasonic wave and heat thereto.

Figure 26:
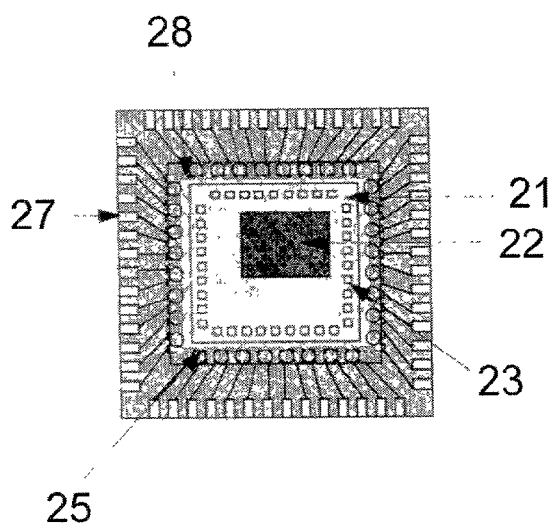
FIG. 26 is a top plan view of the PCB illustrating a state that the glass including the CMOS image sensor chip bonded by means of ultrasonic wave and heat has been inserted to the PCB, and that the second gold bump has been bonded with the PCB by means of ultrasonic wave and heat.
Figure 27:
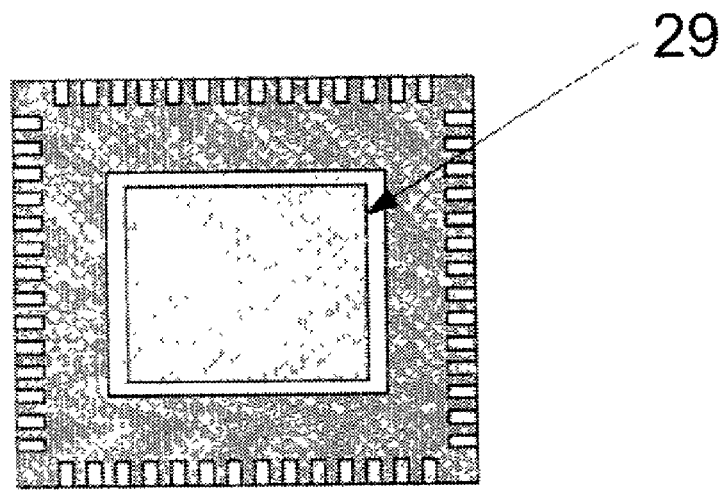
FIG. 27 is a top plan view of the PCB illustrating a state that epoxy resin has been molded after taking the steps until FIG. 26.
Figure 28:
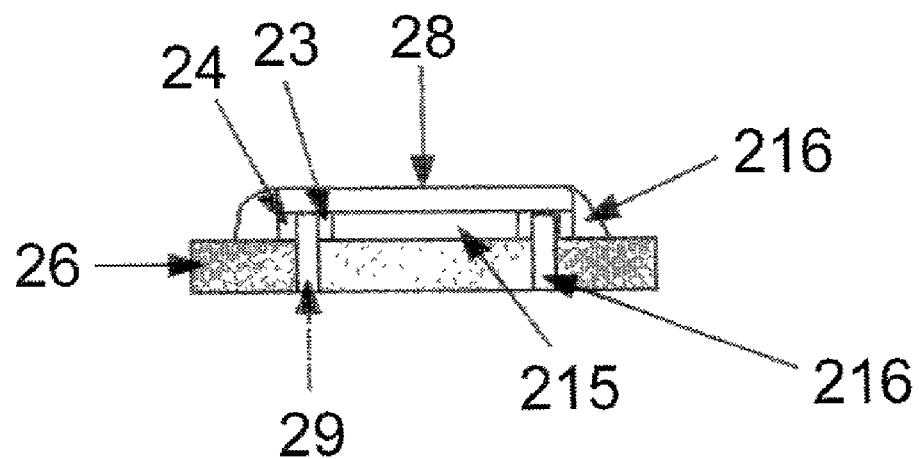
FIG. 28 is a cross sectional view of the PCB illustrating a state that epoxy resin has been molded after taking the steps up to FIG. 26.

FIG. 26 is a top plan view of the PCB illustrating a state that the glass including the CMOS image sensor chip bonded by means of ultrasonic wave and heat has been inserted to the PCB, and that the second gold bump has been bonded with the PCB by means of ultrasonic wave and heat. FIGS. 27 and 28 are a top plan view and a cross sectional view of the PCB illustrating a state that epoxy resin has been molded after taking the steps from FIG. 18 to FIG. 26 to air-tighten the portion where the CMOS image sensor chip is mounted on a surface opposed to the surface where the chip is mounted in the PCB.

In the process of fabricating the image sensor module according to the present invention, the printed circuit 25 is formed on glass in FIG. 19. A pattern of the circuit includes the first gold bump 23 and the second gold bump 24.

As shown in FIG. 21, the first gold bump 23 is formed on the glass 25 so as to be electrically connected to a pattern 210 of a CMOS image sensor chip.

As shown in FIG. 22, the second gold bump 24 is formed on the glass so as to be electrically connected to the PCB 26 after forming the first gold bump as shown in FIG. 21.

As shown in FIG. 15, the glass is bonded with the CMOS image sensor chip 21 by means of ultrasonic wave and heat after forming the first and the second gold bumps so that the pattern 210 of the chip 21 can be electrically connected to the first gold bump.

As shown in FIG. 25, the bonded glass 211 is inserted to the space 213 cut at a size equivalent to the chip 21 of the PCB 212 so that the pattern 210 of the chip 21 can be electrically connected to the first gold bump 23 on the CMOS image sensor chip 21.

As shown in FIG. 26, the pattern 214 of the PCB is bonded with the second gold bump 24 by means of ultrasonic wave and heat so as to be electrically connected to each other.

After taking the steps up to FIG. 26, a rear surface of the flexible PCB 26 is molded by means of epoxy resin, as shown in FIGS. 27 and 28, so as to air-tighten an image area 22 of the chip 21 and the chip 21. Here, the molded portion 29 serves to maintain air-tightness among the chip 21, the glass 211 and the flexible PCB 26.

The method for fabricating an image sensor module according to the present invention as described above has an advantage of minimizing the thickness of a package including a solid-state pickup device referred to as CCD or CMOS by changing the conventional wire bonding method to a gold bump method.

Accordingly, when a flexible PCB is employed instead of the conventional ceramic PCB or an epoxy PCB, it is sufficient to put a cable pin array of the flexible PCB onto a connector of a digital signal processor (DSP) board, unlike the conventional method of soldering the PCB with the DSP board. Therefore, the post-process of mounting a module on the DSP board can be simplified. Moreover, the nature of free positioning of the flexible PCB makes it applicable to a variety of products.

Furthermore, when the flexible PCB is employed under the conventional technology, problems arise such as a wire is not so adhered to the flexible PCB in the course of wire-bonding and the wire becomes unstable even after the wire-bonding. Also, when an image sensor chip is air-tightened, the flexible PC is bent due to high temperature under the conventional technology. The present invention solved these problems and provides a module of high reliability and easy manageability by employing gold bumps instead of the wire as well as by air-tightens an image area by means of glass (or an IR-filter) right above.

Employing the gold bumps also serve to solve the problems attributable to the wire such as electric characteristics are deteriorated due to the long electric path, breaking of the wire, contact with an adjacent wire, etc.

A super slim size is demanded when the CMOS image sensor module is to be attached to a mobile communication terminal, and the method for fabricating an image sensor module according to the present invention satisfies such demand. Also, the factors that may affect the image due to the particles within hollows are almost eliminated by minimizing the hollows within a module.

The present invention further provides advantages of reducing weight, thickness, length and size as well as enhancing air-tightness and reliability in the process of packaging the COG CMOS image sensor module.

The present invention also drastically contributed to reducing weight, thickness, length and size of the module through minimization of the hollows between the chip and the glass by allocating the glass (or the IR-filter) on a surface right above the image area (the image recognizing portion) of the image sensor chip and by enhancing the air-tightness.

The present invention further provides a module of high reliability and easy manageability to solve problems arisen under the conventional technology due to an employment of ceramic PCB or epoxy PCB such as instability of a wire even after the wire-bonding and problematic air-tightening of an image sensor chip, by employing gold bumps instead of the wire as well as by air-tightening an image area by means of glass (or an IR-filter) right above.

Employing the gold bumps also serves to solve the problems attributable to the wire such as electric characteristics are deteriorated due to the long electric path, breaking of the wire, contact with an adjacent wire, etc.

As described above, the present invention provides a method for fabricating a COG CMOS image sensor module of high reliability and reduced weight, thickness, length and size.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An image sensor module, comprising:
   a PCB for transferring and transmitting electric signals and having a circuit, the PCB having an opening at a predetermined portion therethrough;
   an image chip seated in the opening;
   a transparent medium having a printed circuit of a predetermined pattern on a first surface thereof;
   a first bump and a second bump formed on the first surface of the transparent medium, the first bump being electrically connected to a chip pattern of the image chip seated in the PCB, the second bump being electrically connected to the circuit of the PCB and situated between the PCB and the printed circuit of the transparent medium; and
   epoxy resin molded to the predetermined portion of a rear surface of the PCB, on in which the image chip is mounted.

2. The image sensor module of claim 1, wherein the predetermined transparent medium is either glass or an IR filter.

3. The image sensor module of claim 1, wherein the bumps are composed of a medium having high conductivity such as gold or lead.

4. The image sensor module of claim 1, wherein the bonding is performed by means of ultrasonic wave or heat.

5. An image sensor module in accordance with claim 1, further comprising:
   a molded material filled up with the epoxy resin to a glass surface between the first bump and the second bump for maintaining air-tightness.

6. The image sensor module of claim 5, wherein the predetermined transparent medium is either glass or an IR filter.

7. The image sensor module of claim 5, wherein the image chip is seated on a hollow area formed in a predetermined portion of the PCB so that a pattern of an image chip can be matchably bonded with the first bump, and that the transparent medium can be disposed therebetween.

8. The image sensor module of claim 5, wherein the bumps are composed of a medium having high conductivity such as gold or lead.

9. The image sensor module of claim 5, wherein the bonding is performed by means of ultrasonic wave or heat.

10. An image sensor module in accordance with claim 5, wherein the PCB is a hard PCB.

11. An image sensor module in accordance with claim 1, wherein the PCB is a flexible PCB.

12. An image sensor module in accordance with claim 1, wherein the PCB is a hard PCB.

13. An image sensor module, comprising:
   a PCB for transferring and transmitting electric signals and having a circuit, the PCB having an opening at a predetermined portion therethrough;
   an image chip seated in the opening;
   a transparent medium having a printed circuit of a predetermined pattern on a first surface thereof; and
   a first bump and a second bump formed on the first surface of the transparent medium, the first bump being electrically connected to a chip pattern of the image chip seated in the PCB, the second bump being electrically connected to the circuit of the PCB and situated between the PCB and the printed circuit of the transparent medium.

* * * * *